(12) United States Patent  (10) Patent No.: US 8,295,182 B2
Jula et al.  (45) Date of Patent: Oct. 23, 2012

(54) ROUTED EVENT TEST SYSTEM AND METHOD

(75) Inventors: James Jula, Portland, OR (US);
 Kenneth Skala, Fremont, CA (US);
 Vicki L. Skala, legal representative,
 Tustin, CA (US); Jeffrey Currin,
 Livermore, CA (US)

(73) Assignee: Credence Systems Corporation,
 Milpitas, CA (US)

( * ) Notice: Subject to any disclaimer, the term of this patent is extended or adjusted under 35 U.S.C. 154(b) by 247 days.

(21) Appl. No.: 12/167,052

(22) Filed: Jul. 2, 2008

(65) Prior Publication Data

US 2009/0076761 A1  Mar. 19, 2009

Related U.S. Application Data

(60) Provisional application No. 60/958,338, filed on Jul. 3, 2007.

(51) Int. Cl.
 *H04L 1/00* (2006.01)
(52) U.S. Cl. ...................................... 370/241
(58) Field of Classification Search .................. 370/241, 370/242–252; 702/117–121
 See application file for complete search history.

(56) References Cited

U.S. PATENT DOCUMENTS

| | | | |
|---|---|---|---|
| 3,478,325 A | 11/1969 | Oeters et al. |
| 3,633,113 A | 1/1972 | Grubel et al. |
| 3,976,940 A | 8/1976 | Chau et al. |
| 4,063,308 A | 12/1977 | Collins et al. |
| 4,079,456 A | 3/1978 | Lunsford et al. |
| 4,102,491 A | 7/1978 | DeVito et al. |
| 4,130,866 A | 12/1978 | Ono |
| 4,217,639 A | 8/1980 | Hartley et al. |
| 4,231,104 A | 10/1980 | St. Clair |
| 4,270,116 A | 5/1981 | Ichimiya et al. |
| 4,290,133 A | 9/1981 | Stewart et al. |
| 4,310,802 A | 1/1982 | Ichimiya et al. |
| 4,321,687 A | 3/1982 | Parsons et al. |
| RE31,056 E | 10/1982 | Chau et al. |
| 4,354,268 A | 10/1982 | Michel et al. |
| 4,386,401 A | 5/1983 | O'Brien |
| 4,419,739 A | 12/1983 | Blum |
| 4,428,042 A | 1/1984 | Niethhammer et al. |
| 4,430,826 A | 2/1984 | Ryaa |
| 4,451,918 A | 5/1984 | Gillette |
| 4,482,983 A | 11/1984 | Siechta, Jr. |
| 4,486,832 A | 12/1984 | Haubner et al. |
| 4,490,821 A | 12/1984 | Lacher |
| 4,497,022 A | 1/1985 | Cormier et al. |
| 4,517,661 A | 5/1985 | Graf et al. |
| 4,564,953 A | 1/1986 | Werking |
| 4,639,919 A | 1/1987 | Chang et al. |
| 4,642,561 A | 2/1987 | Groves et al. |

(Continued)

FOREIGN PATENT DOCUMENTS

EP  0136207  4/1985

(Continued)

*Primary Examiner* — Frank Duong

(57) ABSTRACT

An efficient automated test system and method are presented. In one embodiment, an automated test system is implemented in a routed event distribution architecture. In one exemplary implementation, an automated test system includes a plurality of test instruments, a switched event bus, and a test controller component. The plurality of test instruments perform testing. The switched event bus communicatively couples the plurality of instruments. The switched event bus comprises an event distribution switch that flexibly routes event information across event lines of the switched event bus. The test controller controls the testing and the switched event bus.

20 Claims, 5 Drawing Sheets

U.S. PATENT DOCUMENTS

| | | |
|---|---|---|
| 4,646,299 A | 2/1987 | Schinabeck et al. |
| 4,660,197 A | 4/1987 | Wrinn et al. |
| 4,682,330 A | 7/1987 | Millham |
| 4,707,834 A | 11/1987 | Firsch et al. |
| 4,731,768 A | 3/1988 | Easterday |
| 4,741,004 A | 4/1988 | Kane |
| 4,779,221 A | 10/1988 | Magliocco et al. |
| 4,789,835 A | 12/1988 | Herlein |
| 4,806,852 A | 2/1989 | Swan et al. |
| 4,827,437 A | 5/1989 | Blanton |
| 4,875,006 A | 10/1989 | Henley |
| 4,876,501 A | 10/1989 | Ardini et al. |
| 4,894,823 A | 1/1990 | Adelmann et al. |
| 4,928,278 A | 5/1990 | Otsuji et al. |
| 4,931,723 A | 6/1990 | Jeffrey et al. |
| 4,996,474 A | 2/1991 | Tambe et al. |
| 5,018,145 A | 5/1991 | Kikuchi et al. |
| 5,023,840 A | 6/1991 | Tobita |
| 5,025,205 A | 6/1991 | Mydill et al. |
| 5,177,630 A | 1/1993 | Goutzoulis et al. |
| 5,212,443 A | 5/1993 | West et al. |
| 5,225,772 A | 7/1993 | Cheung et al. |
| 5,274,796 A | 12/1993 | Conner |
| 5,293,520 A | 3/1994 | Hayashi |
| 5,315,299 A | 5/1994 | Matsumoto |
| 5,432,797 A | 7/1995 | Takano |
| 5,436,853 A | 7/1995 | Shimohara |
| 5,477,139 A | 12/1995 | West et al. |
| 5,485,457 A | 1/1996 | Aramaki |
| 5,557,196 A | 9/1996 | Ujiie |
| 5,642,478 A | 6/1997 | Chen et al. |
| 5,654,971 A | 8/1997 | Heitele et al. |
| 5,742,188 A | 4/1998 | Jiang et al. |
| 5,764,524 A | 6/1998 | Andersson et al. |
| 5,815,634 A | 9/1998 | Daum et al. |
| 5,835,506 A | 11/1998 | Kuglin |
| 5,886,660 A | 3/1999 | Loewenstein |
| 5,940,467 A | 8/1999 | Fransson |
| 5,948,115 A | 9/1999 | Dinteman |
| 5,986,447 A * | 11/1999 | Hanners et al. ............ 324/158.1 |
| 6,028,439 A * | 2/2000 | Arkin et al. ............. 324/762.02 |
| 6,185,509 B1 | 2/2001 | Wilstrup et al. |
| 6,356,850 B1 | 3/2002 | Wilstrup et al. |
| 6,362,647 B1 | 3/2002 | Nakaya |
| 6,434,211 B1 | 8/2002 | Lloyd et al. |
| 6,466,007 B1 * | 10/2002 | Prazeres da Costa et al. ......................... 324/158.1 |
| 6,590,509 B2 | 7/2003 | Labrie |
| 6,928,387 B1 | 8/2005 | West |
| 7,113,886 B2 | 9/2006 | West |
| 7,502,326 B2 * | 3/2009 | Evans ......................... 370/241 |
| 2002/0133325 A1 | 9/2002 | Hoare et al. |
| 2002/0188888 A1 | 12/2002 | Rivoir |
| 2003/0035502 A1 | 2/2003 | Boerker |
| 2007/0245199 A1* | 10/2007 | Pochowski ................... 714/742 |

FOREIGN PATENT DOCUMENTS

| | | |
|---|---|---|
| EP | 0208049 | 1/1987 |
| EP | 0228332 | 7/1987 |
| EP | 0343537 | 11/1989 |
| EP | 0356967 | 3/1990 |
| GB | 2189890 | 11/1987 |
| GB | 2195029 | 3/1988 |

* cited by examiner

ROUTED EVENT TEST SYSTEM AND METHOD

RELATED APPLICATIONS

This Application claims priority to and the benefit of U.S. Provisional Application No. 60/958,338 filed Jul. 3, 2007 entitled "A ROUTED EVENT TEST SYSTEM AND METHOD", which is incorporated herein by this reference.

FIELD OF THE INVENTION

The present invention relates to the field of automated test equipment.

BACKGROUND OF THE INVENTION

Electronic and optical systems have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data in most areas of business, science, education and entertainment. Electronic systems providing these advantageous results are often complex and are tested to ensure proper performance. However, traditional approaches to automated testing can be relatively time consuming and expensive.

Generally, the speed at which a testing is performed can have a significant impact on the cost of testing. As DUTs become more complex and sophisticated the testing also becomes more complex and have a variety of instruments that communicate with one another. Traditional testing systems typically have a bused event architecture that is rather limited. When one instrument gains control of the bus the other instruments are usually precluded from communicating with one another. FIG. 4 is a block diagram of an exemplary conventional bused event architecture. This approach can impact the test production throughput while consuming limited bus resources.

SUMMARY

An efficient automated test system and method are presented. In one embodiment, an automated test system is implemented as a routed event distribution architecture. In one exemplary implementation, an automated test system includes a plurality of test instruments, a switched event bus, and a test controller component. The plurality of test instruments perform testing. The switched event bus communicatively couples the plurality of instruments. The switched event bus comprises an event distribution switch that flexibly routes event information across event lines of the switched event bus. The test controller controls the testing and the switched event bus.

DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

DETAILED DESCRIPTION

Figure 1:
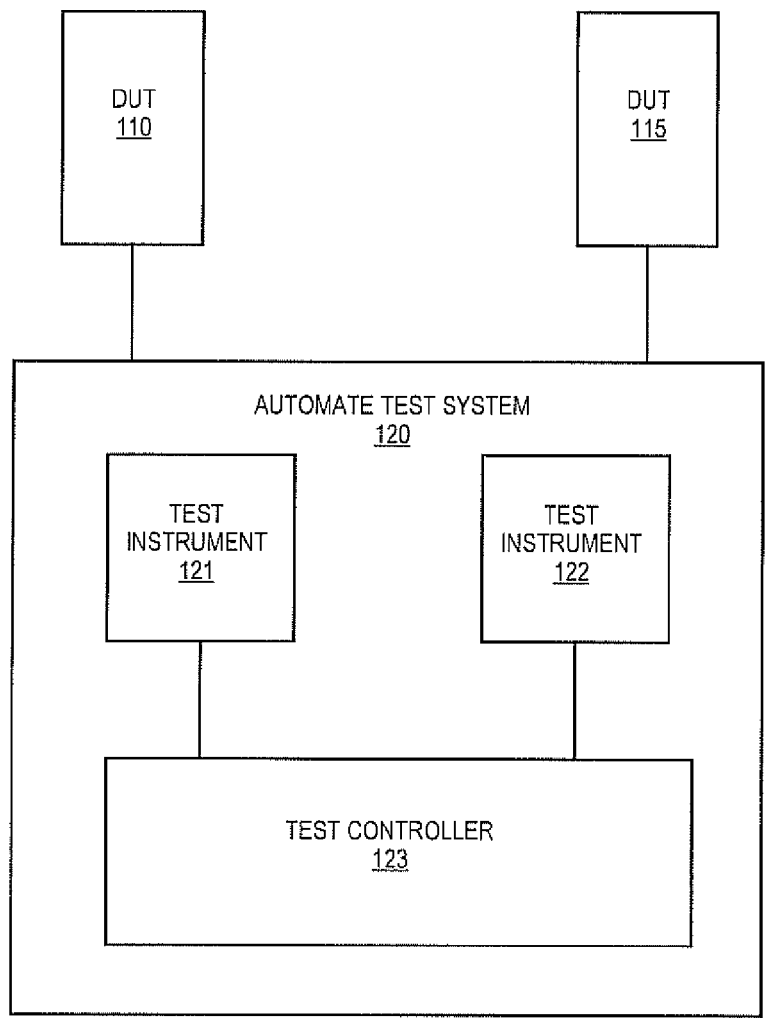
FIG. 1 is a block diagram of an exemplary automated test system in accordance with one embodiment of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating" "determining", "displaying" or the like, refer to the action and processes of a computer system, or similar processing device (e.g., an electrical, optical, or quantum, computing device) that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

Present invention automated test equipment (ATE) systems and methods are described. In one embodiment, signal processing is performed in real time. In addition, testing configuration flexibility can be facilitated including in the field (e.g., at a customer facility, remote location, etc.) configuration capabilities. In one exemplary implementation, parallel testing of devices is also supported. These and other features are set forth in more detail in the following description.

FIG. 1 is a block diagram of exemplary automated testing environment 100 in accordance with one embodiment of the present invention. Automated testing environment 100 includes device under test (DUT) 110 and 115, automated test system 120 which includes automated test instruments 121 and 122, and control station 123. Device under test 110 and 115 are selectively coupled to automated test instruments 121 and 122 which in turn are selectively coupled to control station 123.

The components of automated testing environment 100 cooperatively operate to provide efficient testing of device under test 110 and 115. Device under test 110 and device under test 115 are the devices being tested. In one embodiment, device under test 110 and device under test 115 can be tested in parallel. Automated test instrument system 120 coordinates and processes information received from device under test 110 and device under test 115. System controller 130 controls the testing of devices 110 and 115 and receives the processed information from automated test instrument component 120.

It is appreciated that automated test instrument component 120 facilitates efficient and effective testing. In one embodiment, automated test instrument component 120 performs real time digital signal processing. In one embodiment, real time processing includes the time it takes the automated test instrument component to perform the digital signal processing in hardware of the automated test instrument component 120.

Figure 2A:
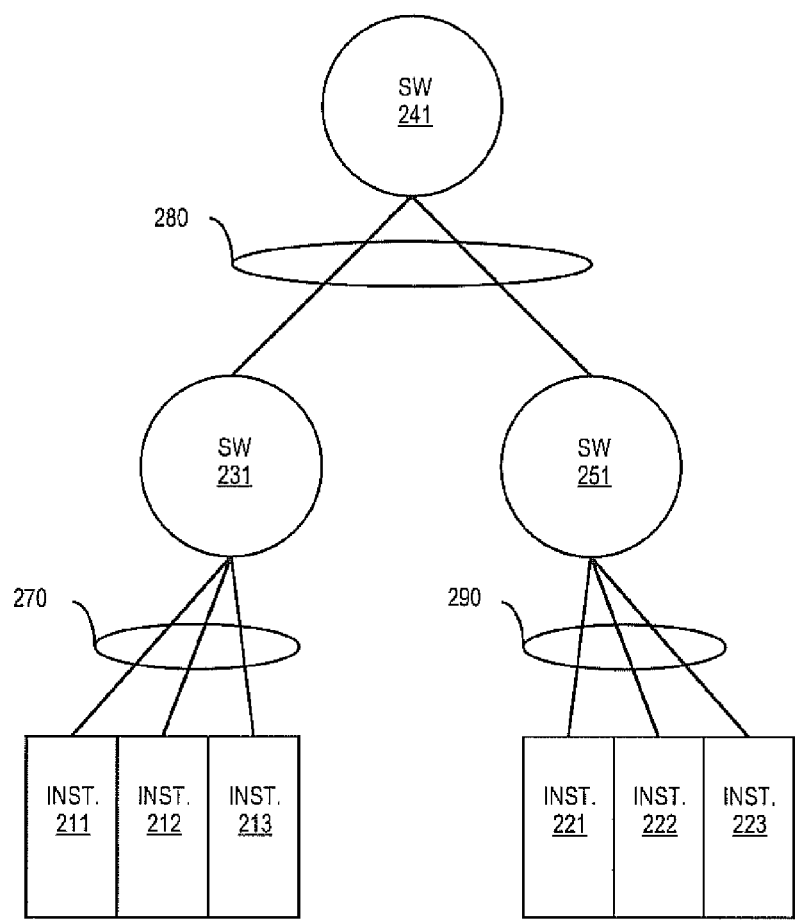
FIG. 2A is a block diagram of an exemplary automated test system in accordance with one embodiment of the present invention.

FIG. 2A is a block diagram of exemplary automated test system 200A in accordance with one embodiment of the present invention. Automated test system 200A includes test instruments 211, 212, 213, 221, 222, and 223, event distribution switch (SW) 231, event distribution switch (SW) 251 and event distribution switch (SW) 241. The test instruments 211, 212, 213, 221, 222, and 223, and event distribution switches 231, 251 and 241 are communicatively coupled in a hierarchical configuration. The test instruments 211, 212, 213, 221, 222, and 223 are in a low hierarchical level, event distribution switches 231 and 251 are in a middle hierarchical level and event distribution switch 241 is in a high level hierarchical level.

The components of automated test system 200 cooperatively operate to test devices. Instruments 211, 212, 213, 221, 222, and 223 direct testing operations and generate test events. Event distribution lines 270, 280 and 290 communicate test event information between components of automated test controller 200. The test events are communicated to other components within automated test controller 200 by being routed through event distribution lines by event distribution switches 231, 241 and 251. In one embodiment, automated test system 200 includes a user interface for interfacing with a user.

In one embodiment, the event distribution switches receive the event indication information and determine routing instructions for the event information. In one exemplary implementation, the event distribution switches are software controlled. The software instructions direct which event lines are going to be used for the different event functions (e.g., qualifiers, failures, etc.). The software configures the switches to route the event information accordingly and then the test controller runs the events for the rest of the test.

For example, if instrument 211 defines an event line as a trigger and instrument 211 wants to send a trigger to 213, 221 and 222 the event distribution switches are configured to route the triggers accordingly. For example, one of the event lines is used as a trigger line coming out of instrument 211 and a determination is made as to which of the event lines going to the other instruments will be utilized as a trigger event line. Once the decision is made, it then determines which resources are available in the switch and the best way to route the event in from one end and distribute it out to the others that are going to receive the event information. For example, distribution switch 231 routes the trigger to instrument 213 and forwards the trigger up the hierarchy to distribution switch 241 which routes the trigger down the hierarchy to distribution switch 251 which in turn routes the trigger to instruments 221 and 222.

It is appreciated that the routing can be established in accordance with a variety of objectives. For example, the routing can be done in a way that is the shortest or fastest. In one exemplary implementation the routing is configured in a manner that facilitates synchronization maintenance. For example, switch routing is selected in a manner so that the instruments have the same timing.

Figure 2B:
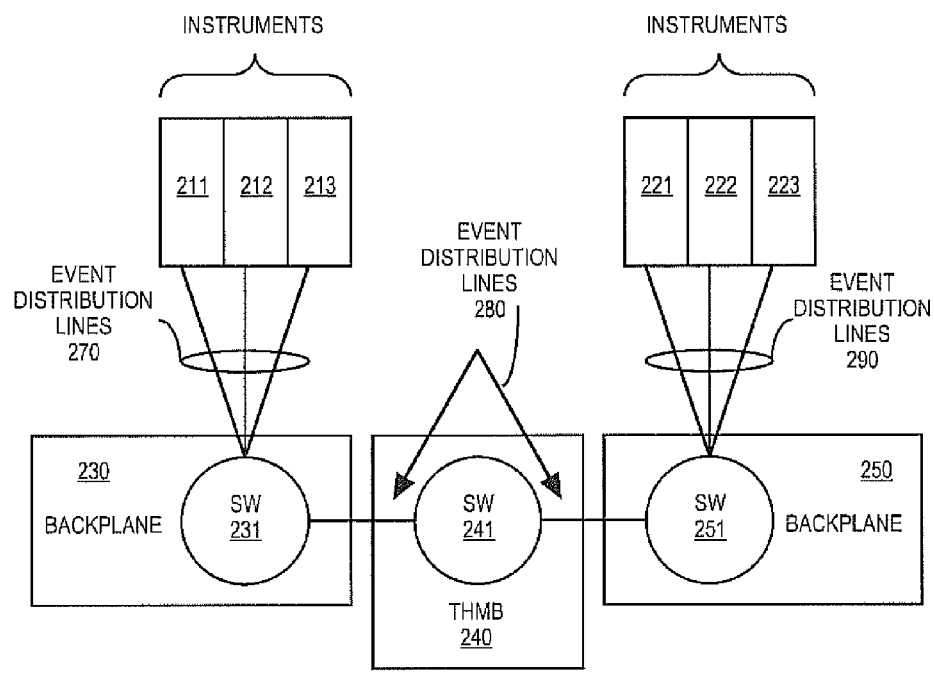
FIG. 2B is a block diagram of an exemplary automated test system in accordance with one embodiment of the present invention.

FIG. 2B is a block diagram of exemplary automated test system 200B in accordance with one embodiment of the present invention. Automated test system 200B is an exemplary implementation of automated test system 200A in which the distribution switches are located in hierarchical components. Automated test system 200 includes test instruments 211, 212, 213, 221, 222, and 223, backplane 230, backplane switch (AKA) test head motherboard (THMB) 240 and backplane 250. Backplane 230 includes event distribution switch (SW) 231 and backplane 250 includes event distribution switch 251. Test head mother board 240 includes event distribution switch 241. The test head motherboard 240 is a higher hierarchical level than the backplane 230 and backplane 250. In one exemplary implementation, the switch 231 of backplane 230 routes signals to and from test instruments 211, 212 and 213, and switch 251 of backplane 250 routes signals to and from test instruments 221, 222 and 223 while the distribution switch 241 of test head motherboard (THMB) 240 routes information between backplane 231 and backplane 251.

Figure 3:
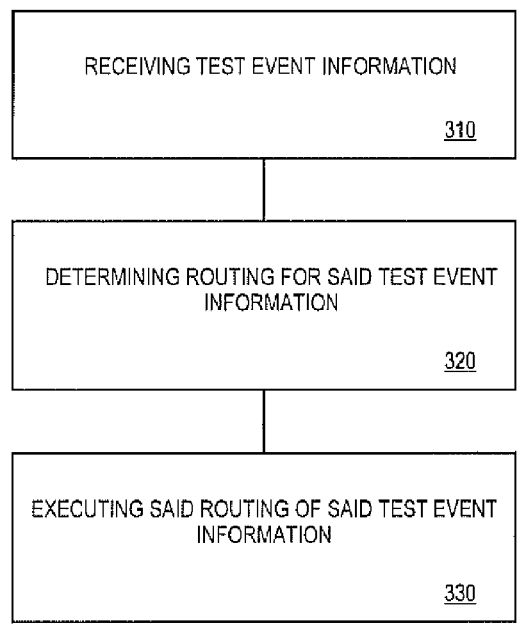
FIG. 3 is a flow chart of an exemplary automated testing methods in accordance with one embodiment of the present invention.
Figure 4:
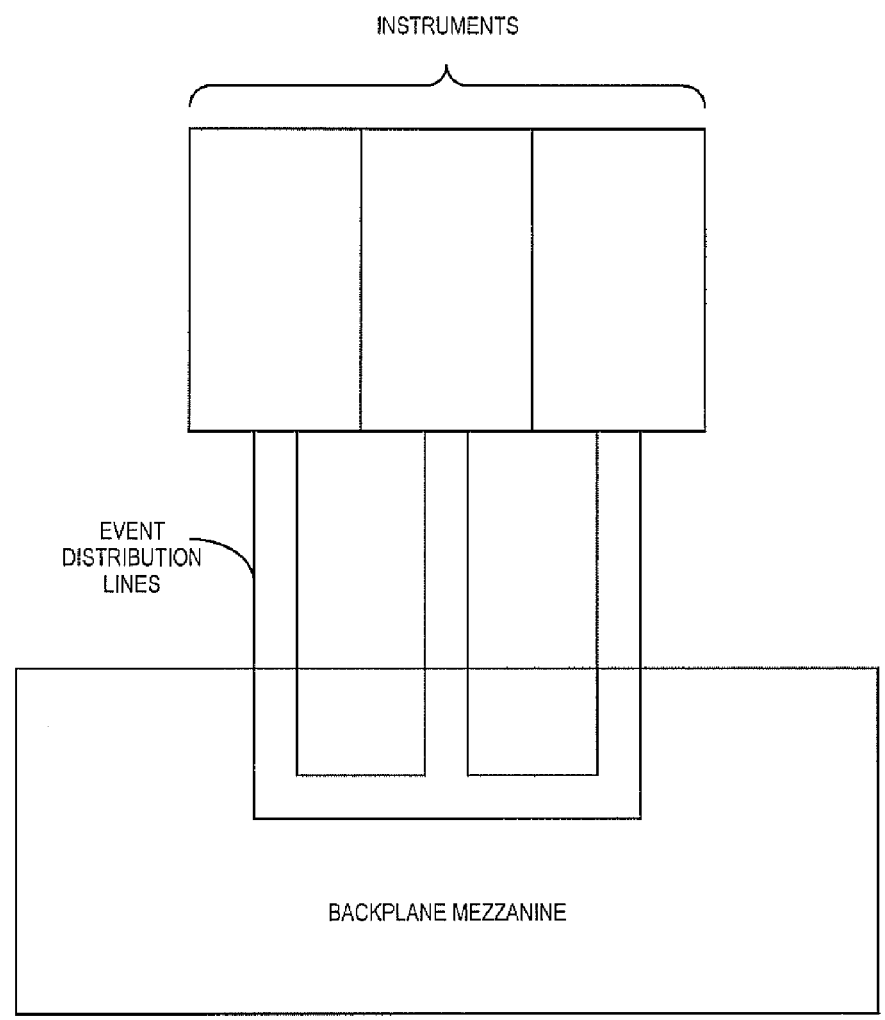
FIG. 4 is a block diagram of an exemplary conventional bused event architecture.

FIG. 3 is a flow chart of automated testing method 300 in accordance with one embodiment of the present invention.

In block 310 test event information is received. It is appreciated that a variety of test event information can be used. For example, test event information can include trigger information, failure information, qualifier information, etc.

At block 320 routing for the test event information is determined. In one embodiment the routing includes analyzing characteristics of a test event. An event characteristic is assigned to an event line in accordance with the analysis. For example, if an analysis indicates an instrument is attempting to communicate a failure event to another instrument, event lines between the instruments are designated as failure event lines for the purposes of communicating the failure event. In one embodiment routing is selected to facilitate synchronization maintenance.

In block 330, routing of the test event information is executed. In one embodiment routing is included in the backplane of a test bucket. In one exemplary implementation a backplane is included in a test bucket and a test head motherboard interconnects a plurality of backplanes (e.g., multiple buckets). Routing is included in a test head mother board for communicatively coupling a plurality of backplanes in different test buckets.

In one embodiment, an event test switch can combine event information from a variety of instruments for routing to other instruments. In one exemplary implementation, an event test switch can be utilized to route information to a test controller.

Thus, the present invention facilitates efficient automated testing of devices. The present approach facilitates re-use of existing test programs to test different DUTs in the same package or test different DUTs in different packages in parallel. The present approach also allows re-use of the same test program in wafer sort and final test. Additionally, this capability allows the diagnosing of different instrument types in parallel.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An automated test instrument comprising:
a plurality of instruments for performing testing:
a switched event bus for communicatively coupling said plurality of instruments, wherein event information is routed by said switched event bus from one of said plurality of instruments to another of said plurality of instruments; and
a controller for controlling said switched event bus.

2. An automated test instrument of claim 1 wherein said switched event bus comprises an event distribution switch.

3. An automated test instrument of claim 2 wherein said event distribution switch is flexibly programmable to communicatively couple an event line from one of said plurality of instruments to event lines associated with other of said plurality of instruments.

4. An automated test instrument of claim 2 wherein said event distribution switch assigns an event characteristic to event lines.

5. An automated test instrument of claim 4 wherein said event characteristic comprises a trigger.

6. An automated test instrument of claim 4 wherein said event characteristic comprises a failure.

7. An automated test instrument of claim 4 wherein said event characteristic comprises a qualifier.

8. An automated test instrument of claim 4 wherein said event distribution switch is included in a backplane of a test bucket.

9. An automated test instrument of claim 2 wherein said event distribution switch is included in a test head mother board for communicatively coupling to a backplane of a test bucket.

10. An automated test instrument of claim 2 wherein said event distribution switch communicatively couples test instruments in a star configuration.

11. A testing method comprising:
receiving test event information at a switch on a switched event bus;
determining routing for said test event information at said switch on said switched event bus; and
executing said routing of said test event information at said switch on said switched event bus, wherein said event information is routed by said switched event bus from one of a plurality of instruments to another of said plurality of instruments.

12. A testing method of claim 11 wherein said determining routing comprises analyzing characteristics of a test event.

13. A testing method of claim 11 wherein said determining comprises assigning a event characteristic to an event line.

14. A testing method of claim 11 wherein said routing is selected to facilitate synchronization maintenance.

15. A testing method of claim 11 wherein routing is included in a backplane of a test bucket.

16. An automated test instrument of claim 11 wherein said routing is included in a test head mother board for communicatively coupling to a backplane of a test bucket.

17. A test system comprising:
an interface for interfacing with a device under test;
a test controller for controlling testing including communicatively coupling a plurality of test instruments in a routed switched architecture, wherein event information is routed by said switched event bus from one of a plurality of instruments to another of said plurality of instruments.

18. A test system of claim 17 wherein said test controller performs a routed distribution process.

19. A test system of claim 17 wherein said test controller analyzes test events and routes said test events in accordance with said analysis.

20. A test system of claim 17 wherein said test controller combines test events and routes said test events in accordance with said analysis.

* * * * *